US012022631B1

(12) United States Patent
Cao (10) Patent No.: US 12,022,631 B1
(45) Date of Patent: Jun. 25, 2024

(54) FOLDED DUAL-SCREEN DISPLAY WITH DIFFERENT VIWEING ANGLES FOR MULTIPLE USERS

(71) Applicant: Junxuan Cao, Xinyi (CN)

(72) Inventor: Junxuan Cao, Xinyi (CN)

( * ) Notice: Subject to any disclaimer, the term of this patent is extended or adjusted under 35 U.S.C. 154(b) by 0 days.

(21) Appl. No.: 18/453,250

(22) Filed: Aug. 21, 2023

(30) Foreign Application Priority Data

Aug. 8, 2023 (CN) .......................... 202322132565.2

(51) Int. Cl.
*H05K 5/02* (2006.01)
*F16C 11/04* (2006.01)

(52) U.S. Cl.
CPC ............ *H05K 5/0226* (2013.01); *F16C 11/04* (2013.01)

(58) Field of Classification Search
CPC ...... F16C 11/04; H05K 5/0226; G06F 1/1681
See application file for complete search history.

(56) References Cited

U.S. PATENT DOCUMENTS

| | | | | |
|---|---|---|---|---|
| 9,464,471 B1* | 10/2016 | Chen | ..................... | G06F 1/1681 |
| 9,540,855 B2* | 1/2017 | Kato | ..................... | G06F 1/1618 |
| 9,606,578 B2* | 3/2017 | Yuan | ..................... | G06F 1/1616 |
| 9,611,680 B2* | 4/2017 | Xu | ..................... | E05D 3/122 |
| 9,714,533 B2* | 7/2017 | Kuramochi | ............... | E05D 3/12 |
| 10,037,058 B2* | 7/2018 | Kato | ..................... | E05D 3/06 |
| 10,152,094 B1* | 12/2018 | Holung | ................. | G06F 1/1681 |
| 10,401,914 B2* | 9/2019 | Shang | ....................... | E05D 5/04 |
| 10,563,438 B1* | 2/2020 | Chen | ......................... | E05D 5/10 |
| 10,845,849 B2* | 11/2020 | Lin | ........................... | E05D 7/00 |
| 11,016,529 B1* | 5/2021 | Tucker | ................. | G06F 1/1647 |
| 11,163,339 B2* | 11/2021 | Lin | ..................... | G06F 1/1618 |
| 2012/0096678 A1* | 4/2012 | Zhang | .................. | G06F 1/1681 16/302 |
| 2014/0071648 A1* | 3/2014 | Sip | ..................... | G06F 1/1616 361/809 |
| 2015/0159413 A1* | 6/2015 | Chen | ..................... | G06F 1/1681 16/342 |
| 2015/0267450 A1* | 9/2015 | Chiang | ................. | G06F 1/1681 16/354 |
| 2015/0342068 A1* | 11/2015 | Su | ......................... | H04M 1/022 16/354 |
| 2015/0362958 A1* | 12/2015 | Shang | ..................... | E05D 3/122 16/334 |
| 2016/0010374 A1* | 1/2016 | Hsu | ........................ | G06F 1/1681 74/414 |

(Continued)

*Primary Examiner* — Rockshana D Chowdhury
*Assistant Examiner* — Douglas R Burtner (57) ABSTRACT

The present disclosure discloses a dual-screen display. The dual-screen display includes a first display screen, a second display screen and a hinge device. The first display screen is electrically connected to the second display screen; the first display screen is connected to the second display screen through the hinge device. The first display screen rotates until a front surface of the first display screen abuts against a front surface of the second display screen, and a back surface of the first display screen abuts against a back surface of the second display screen. By using the hinge device, the first display screen can rotate until the front surface of the first display screen abuts against the front surface of the second display screen, and the back surface of the first display screen abuts against the back surface of the second display screen.

15 Claims, 8 Drawing Sheets

(56) References Cited

U.S. PATENT DOCUMENTS

| | | | |
|---|---|---|---|
| 2016/0011632 A1* | 1/2016 | Hsu | H05K 5/0226 |
| | | | 16/354 |
| 2016/0032633 A1* | 2/2016 | Hsu | E05D 3/122 |
| | | | 16/368 |
| 2016/0102487 A1* | 4/2016 | Kuramochi | E05D 3/122 |
| | | | 16/371 |
| 2016/0201367 A1* | 7/2016 | Kato | G06F 1/1618 |
| | | | 361/679.09 |
| 2016/0215540 A1* | 7/2016 | Yuan | G06F 1/1681 |
| 2017/0351303 A1* | 12/2017 | Kuramochi | G06F 1/1681 |
| 2018/0059740 A1* | 3/2018 | Kato | G06F 1/1681 |
| 2019/0056768 A1* | 2/2019 | Lin | G06F 1/1681 |
| 2020/0103945 A1* | 4/2020 | Yuan | G06F 1/1618 |
| 2020/0291702 A1* | 9/2020 | Hsu | G06F 1/1681 |

* cited by examiner

FOLDED DUAL-SCREEN DISPLAY WITH DIFFERENT VIWEING ANGLES FOR MULTIPLE USERS

CROSS-REFERENCE TO RELATED APPLICATIONS

The application claims priority of Chinese patent application CN202322132565.2, filed on Aug. 8, 2023, which is incorporated herein by reference in its entireties.

TECHNICAL FIELD

The present disclosure relates to a display, and particularly to, a dual-screen display applied to the technical field of display devices.

BACKGROUND

A display is a display tool that displays files on a screen and then reflects the files to human eye. The display is widely used in learning, entertainment, office work, and other aspects. With the increasing material and cultural needs of people, a current display screen size on the market cannot meet people's usage needs. A too small display cannot be watched by multiple people from multiple sides, which affects the display effect and has a poor user experience. Therefore, displays with two screens have emerged to meet the needs.

However, dual-screen displays on the market at preset are all flip type. A hinge connects a first display screen to a second display screen and provides a twisting force required to lifting the first display screen relative to the second display screen. Although the first display screen can be pivoted to be opened, due to the limitation of the design of a first display screen shell and a second display screen shell, the first display screen shell and the second display screen shell would interfere with each other when they are opened to a certain angle, which limits a range of an opening angle. As a result, the dual-screen display can be only watched on the same side and cannot be watched by multiple people on multiple sides. Therefore, the dual-screen display has low practicability and poor user experience.

SUMMARY

In response to the aforementioned problem that two display screens of a dual-screen display in the prior art can only be watched on one side, and a viewing angle of the other display screen cannot be adjusted, the present disclosure provides a dual-screen display. By using a hinge device, a first display screen can rotate until a front surface of the first display screen abuts against a front surface of a second display screen, and a back surface of the first display screen abuts against a back surface of the second display screen, so that a screen body of the first display screen and a screen body of the second display screen can be located on different watching sides for many people to watch. The function of the dual-screen display is expanded. Furthermore, the dual-screen display can be folded in an abutting manner and is convenient to carry, so that the use experience of a user is improved.

The technical solution adopted by the present disclosure to solve the technical problem is as follows: the present disclosure discloses a dual-screen display, wherein the dual-screen display includes a first display screen, a second display screen and a hinge device. The first display screen is electrically connected to the second display screen; the first display screen is connected to the second display screen through the hinge device. The first display screen rotates until a front surface of the first display screen abuts against a front surface of the second display screen, and a back surface of the first display screen abuts against a back surface of the second display screen.

Further, when the first display screen rotates, the first display screen drives the second display screen to rotate opposite to the first display screen through the hinge device.

Further, the hinge device includes a first connection component, a second connection component, and a third connection component; the first connection component is fixedly connected to the first display screen; the second connection component is fixedly connected to the second display screen; the third connection component is rotatably connected to both the first connection component and the second connection component; and when the first connection component rotates, the first connection component drives the second connection component to rotate in a direction opposite to the first connection component through the third connection component.

Further, the first connection component includes a first bevel gear and a first connector; the second connection component includes a second bevel gear and a second connector; the third connection component includes a third bevel gear; the first connector is fixedly connected to the first display screen; the first bevel gear is fixedly clamped to the first connector; the second connector is fixedly connected to the second display screen; the second bevel gear is fixedly clamped to the second connector; and the first bevel gear and the second bevel gear are both connected to the third bevel gear, so that when the first bevel gear rotates, the first bevel gear drives the second bevel gear to rotate in a direction opposite to the first bevel gear through the third bevel gear.

Further, the hinge device further includes a fourth connector; the third bevel gear is provided with a central shaft integrally formed with the third bevel gear; two ends of the central shaft pass through two sides of the third bevel gear; two ends of the fourth connector are connected to the first connector and the second connector; and a middle portion of the fourth connector is clamped to the central shaft.

Further, the fourth connector includes a first connection plate, a second connection plate, a third connection plate, and a fourth connection plate; left and right ends of the first connection plate are connected to the first connector and the second connector and are located at a first end of the first bevel gear and a first end of the second bevel gear; left and right ends of the second connection plate are connected to the first connector and the second connector and are located at a second end of the first bevel gear and a second end of the second bevel gear; the third connection plate and the fourth connection plate are arranged on two sides of the third bevel gear; two ends of the third connection plate and two ends of the fourth connection plate are fixedly connected to the first connection plate and the second connection plate; mounting holes are formed in the third connection plate and the fourth connection plate; and the mounting holes sleeve the central shaft.

Further, each of the third connection plate and the fourth connection plate includes a first connection portion and a second connection portion; the first connection portion and the second connection portion are in splicable connection; one end of the first connection portion is fixedly connected to the first connection plate, and one end of the second connection portion is fixedly connected to the second connection plate; the other end of the first connection portion is provided with a first groove, and the other end of the second connection portion is provided with a second groove; and when the first connection portion is spliced with the second connection portion, the first groove is spliced with the second groove to form the mounting hole.

Further, the first connector includes a first fixing shaft and a first fixing member; the hinge device further includes a first nut; the first fixing member is fixedly connected to one end of the first fixing shaft; the first fixing member is fixedly connected to the first display screen; a first stop portion is arranged between the first fixing member and a connection end of the first fixing shaft; the first connection plate, the first bevel gear, and the second connection plate are connected to the first fixing shaft, and are arranged near the first stop portion in sequence; and the first connection plate, the first bevel gear, and the second connection plate are compressed between the first nut and the first stop portion through the first nut.

Further, the first fixing member includes a first fixing plate and a first connection shaft; the first stop portion is arranged at a connection end of the first connection shaft; one end of the first fixing plate is fixedly connected to the first connection shaft; and the other end of the first fixing plate is fixedly connected to the first display screen.

Further, the second connector includes a second fixing shaft and a second fixing member; the hinge device further includes a second nut; the second fixing member is fixedly connected to one end of the second fixing shaft; the second fixing member is fixedly connected to the second display screen; a second stop portion is arranged between the second fixing member and a connection end of the second fixing shaft; the first connection plate, the second bevel gear, and the second connection plate are connected to the second fixing shaft, and are arranged near the second stop portion in sequence; and the first connection plate, the second bevel gear, and the second connection plate are compressed between the second nut and the second stop portion through the second nut.

Further, the second fixing member includes a second fixing plate and a second connection shaft; the second stop portion is arranged at a connection end of the second connection shaft; one end of the second fixing plate is fixedly connected to the second connection shaft; and the other end of the second fixing plate is fixedly connected to the second display screen.

Further, the hinge device further includes a fifth connection plate; one end of the fifth connection plate is connected to the first fixing shaft and is located between the first nut and a first pad arranged on the first connection shaft, and the other end of the fifth connection plate is connected to the second fixing shaft and is located between the second nut and a first pad arranged on the second fixing shaft.

Further, the first pads are arranged between the first fixing shaft and the second fixing shaft, and are located between the first bevel gear and the first nut as well as between the second bevel gear and the second nut; and two or more second pads are further arranged between the first fixing shaft and the second fixing shaft, and are located between the fifth connection plate and the first nut as well as between the fifth connection plate and the second nut.

Further, the hinge device further includes a shell; one end of the first connection component, one end of the second connection component, and the third connection component are arranged in the shell; the other end of the first connection component is fixedly connected to the first display screen; and the other end of the second connection component is fixedly connected to the second display screen.

Further, the first display screen is connected to the second display screen through a signal transmission line, and the signal transmission line passes through the hinge device.

Further, there are two hinge devices.

Further, the first display screen and the second display screen are flipped up and down.

Further, the dual-screen display further includes a support; the support is arranged in the middle of the back surface of the second display screen; the support is rotatably connected to the second display screen; and the support is configured to support the second display screen and the first display screen.

Further, the support is a U-shaped support; a cover plate is convexly arranged on the back surface of the second display screen; two ends of the U-shaped support are rotatably connected to two sides of the cover plate; and when the U-shaped support is not unfolded, the U-shaped support sleeves an outer side of the cover plate and abuts against a plane of the back surface of the second display screen.

Further, the second display screen is provided with more than one connection interface.

Beneficial effects: the present disclosure discloses a dual-screen display, by using the hinge device, the first display screen can rotate until the front surface of the first display screen abuts against the front surface of the second display screen, and the back surface of the first display screen abuts against the back surface of the second display screen. Furthermore, the first display screen drives the second display screen to rotate opposite to the first display screen through the hinge device, and the support is also arranged on the back surface of the second display screen. A screen body of the first display screen and a screen body of the second display screen can be located on different sides for many people to watch. The function of the dual-screen display is expanded, and a rotating angle of the first display screen and a rotating angle of the second display screen are the same, thereby improving the smoothness of rotation between the display screens. Furthermore, the display is supported by the support to stand, so that the user experience is overall improved.

DETAILED DESCRIPTION OF THE EMBODIMENTS

In order to make the aims, technical solution and effects of the present disclosure will be clearly, the present disclosure is further described below in combination with accompanying drawings and implementations. It should be understood that the specific embodiments described herein are intended only to explain the present disclosure and are not intended to define the present disclosure.

Referring to FIG. 1 to FIG. 9, a dual-screen display provided in the present disclosure can be an extended display or can be used independently. The dual-screen display includes a first display screen 1, a second display screen 2, and a hinge device 3.

Figure 1:
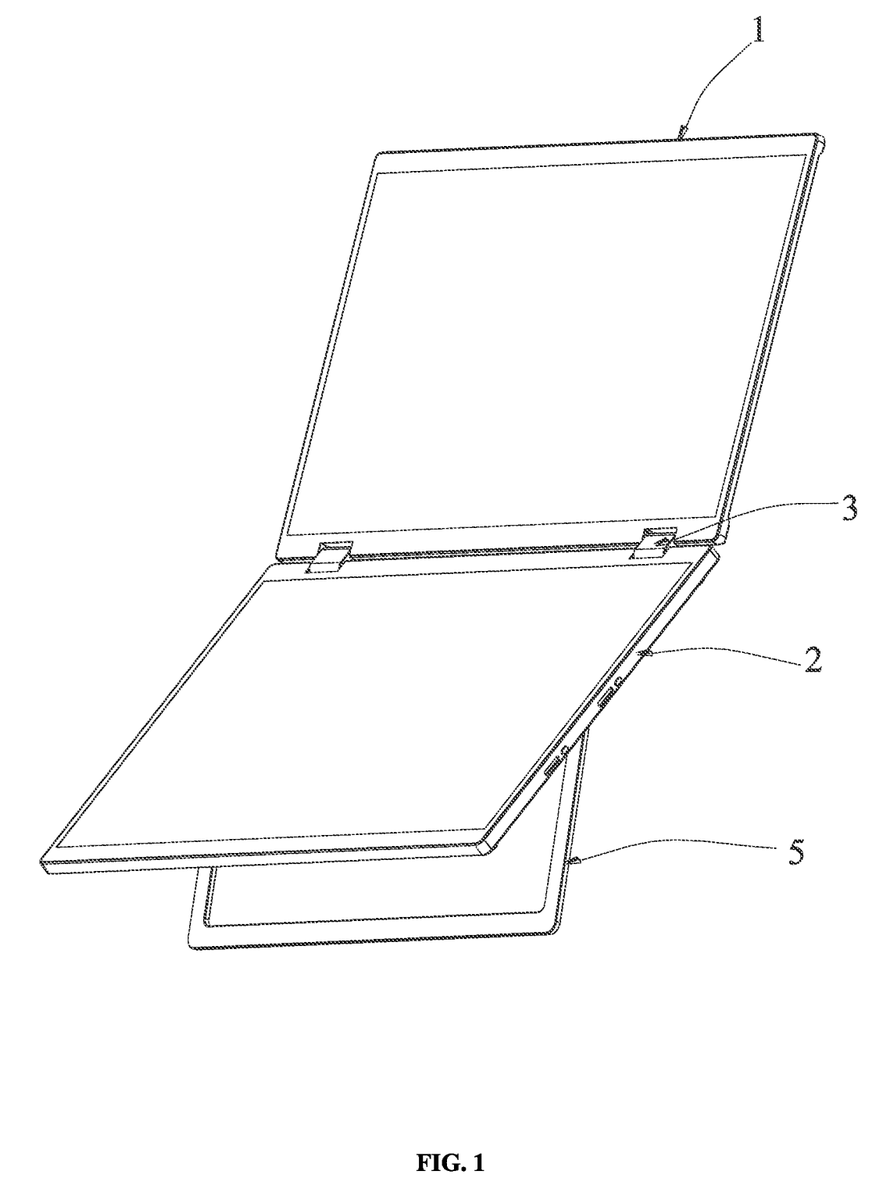
FIG. 1 is a three-dimensional diagram of a front surface of a dual-screen display provided according to the present disclosure.

As shown in FIG. 1, the first display screen 1 is electrically connected to the second display screen 2. The first display screen 1 and the second display screen 2 are connected through a hinge device 3. The first display screen 1 can rotate until a front surface of the first display screen 1 abuts against a front surface of a second display screen 2, and a back surface of the first display screen 1 abuts against a back surface of the second display screen 2, so that a screen body of the first display screen and a screen body of the second display screen can be located on different watching sides for many people to watch. The function of the dual-screen display is expanded. Furthermore, the dual-screen display can be folded in an abutting manner and is convenient to carry, so that the use experience of a user is improved.

In this embodiment, when the first display screen 1 rotates, the first display screen 1 drives the second display screen 2 to rotate opposite to the first display screen 1 through the hinge device 3. The two display screens of the traditional dual-screen display have no connection effect, so they are inconvenient to use. Therefore, in this embodiment, the first display screen 1 is connected to the second display screen and can rotate in opposite directions. During use, the other display screen can be rotated without holding down one display screen, which facilitating use.

Figure 3:
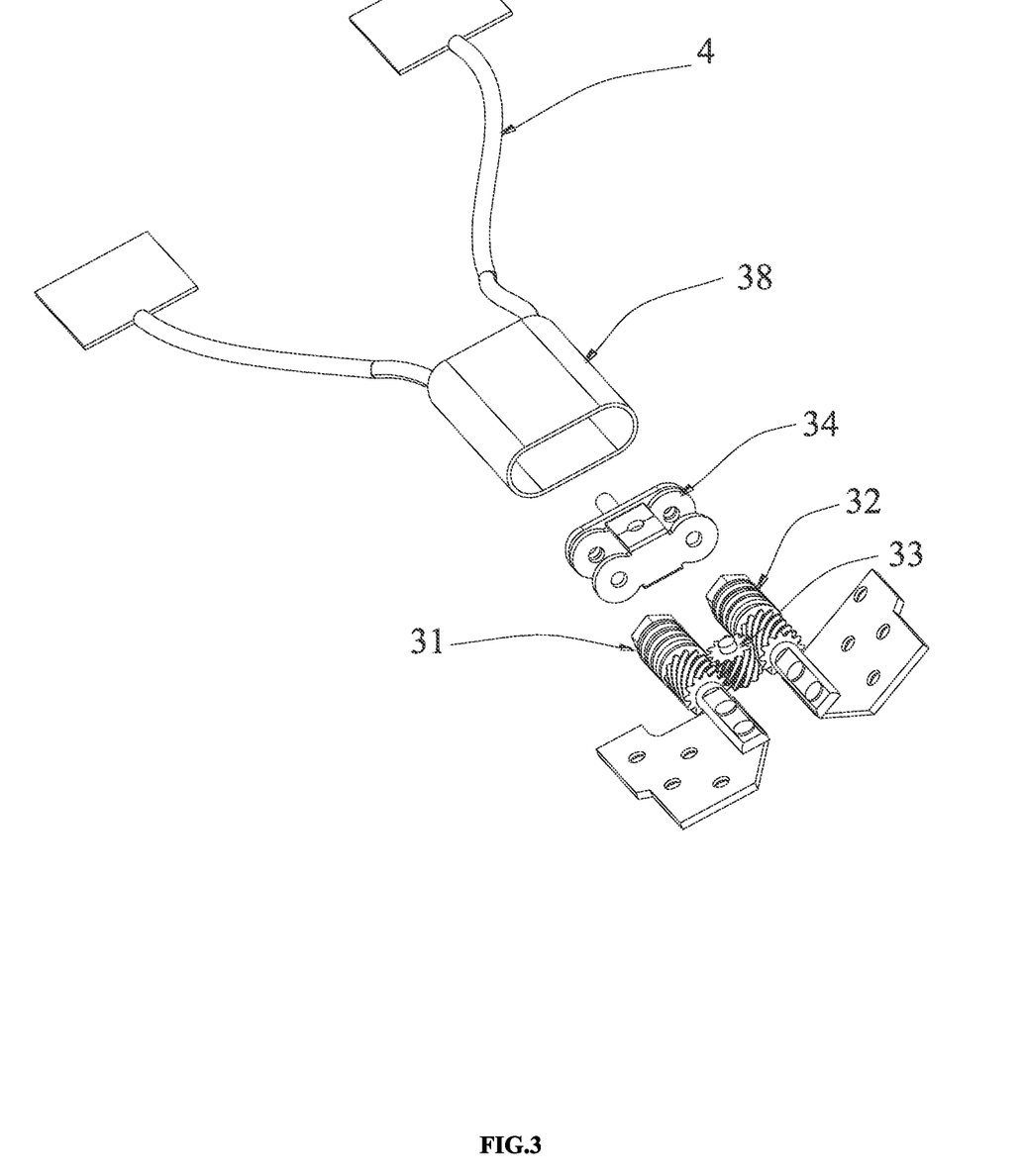
FIG. 3 is an exploded diagram of a hinge device provided according to the present disclosure.

In this embodiment, as shown in FIG. 3, the hinge device 3 includes a first connection component 31, a second connection component 32, and a third connection component 33; the first connection component 31 is fixedly connected to the first display screen 1; the second connection component 32 is fixedly connected to the second display screen 2; the third connection component 33 is rotatably connected to both the first connection component 31 and the second connection component 32; and when the first connection component 31 rotates, the first connection component 31 drives the second connection component 32 to rotate in a direction opposite to the first connection component 31 through the third connection component 33. The rotation of the first connection component 31, the rotation of the second connection component 32, and the rotation of the third connection component 33 drive the first display screen and the second display screen to rotate. This linkage structure makes the first display screen and the second display screen rotate synchronously, achieving rotation of 0-180°, so that the front surface of the first display screen 1 abuts against the front surface of the second display screen 2, and the back surface of the first display screen 1 abuts against the back surface of the second display screen 2.

Figure 4:
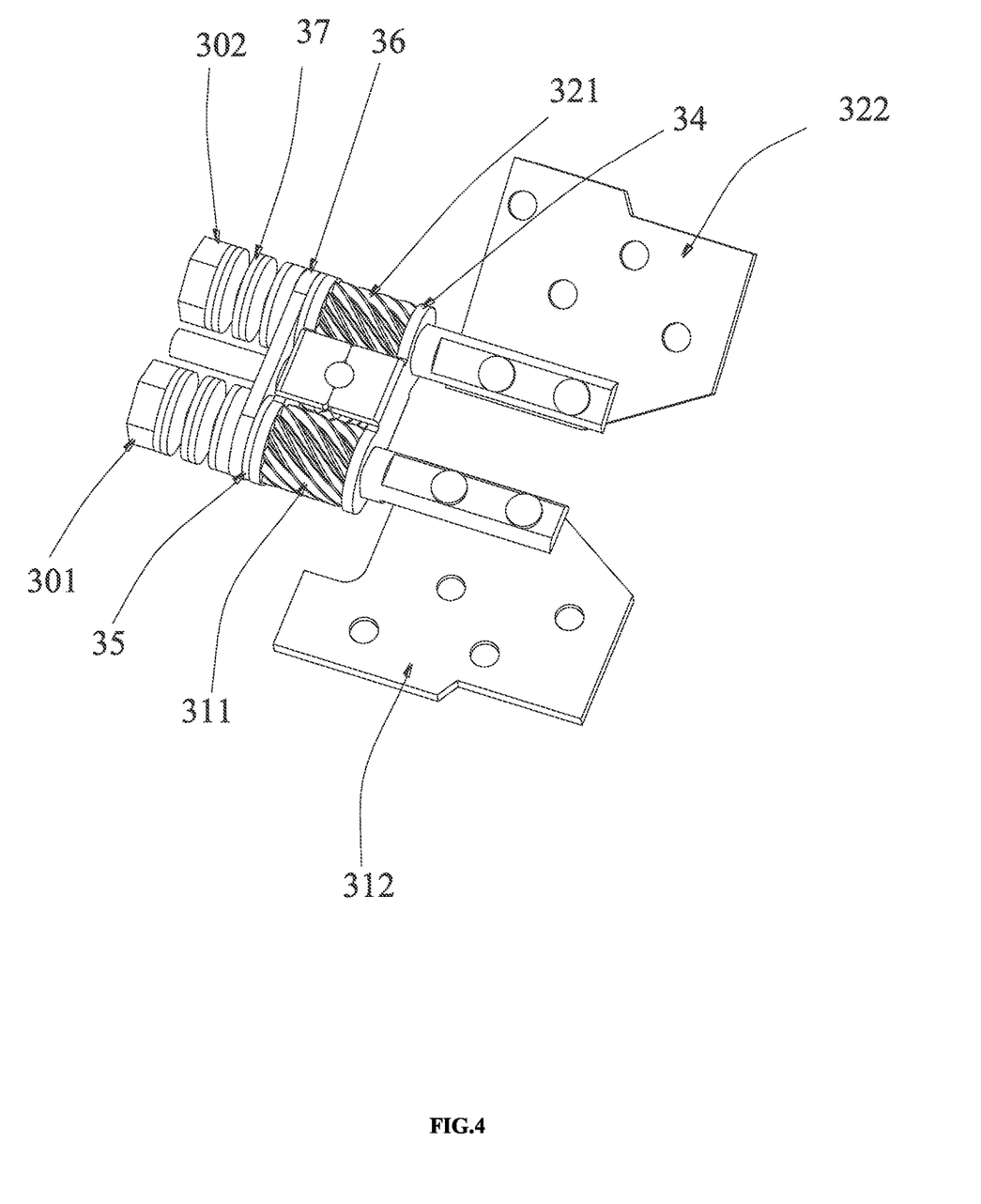
FIG. 4 is a schematic partially structural diagram of a hinge device provided according to the present disclosure.
Figure 5:
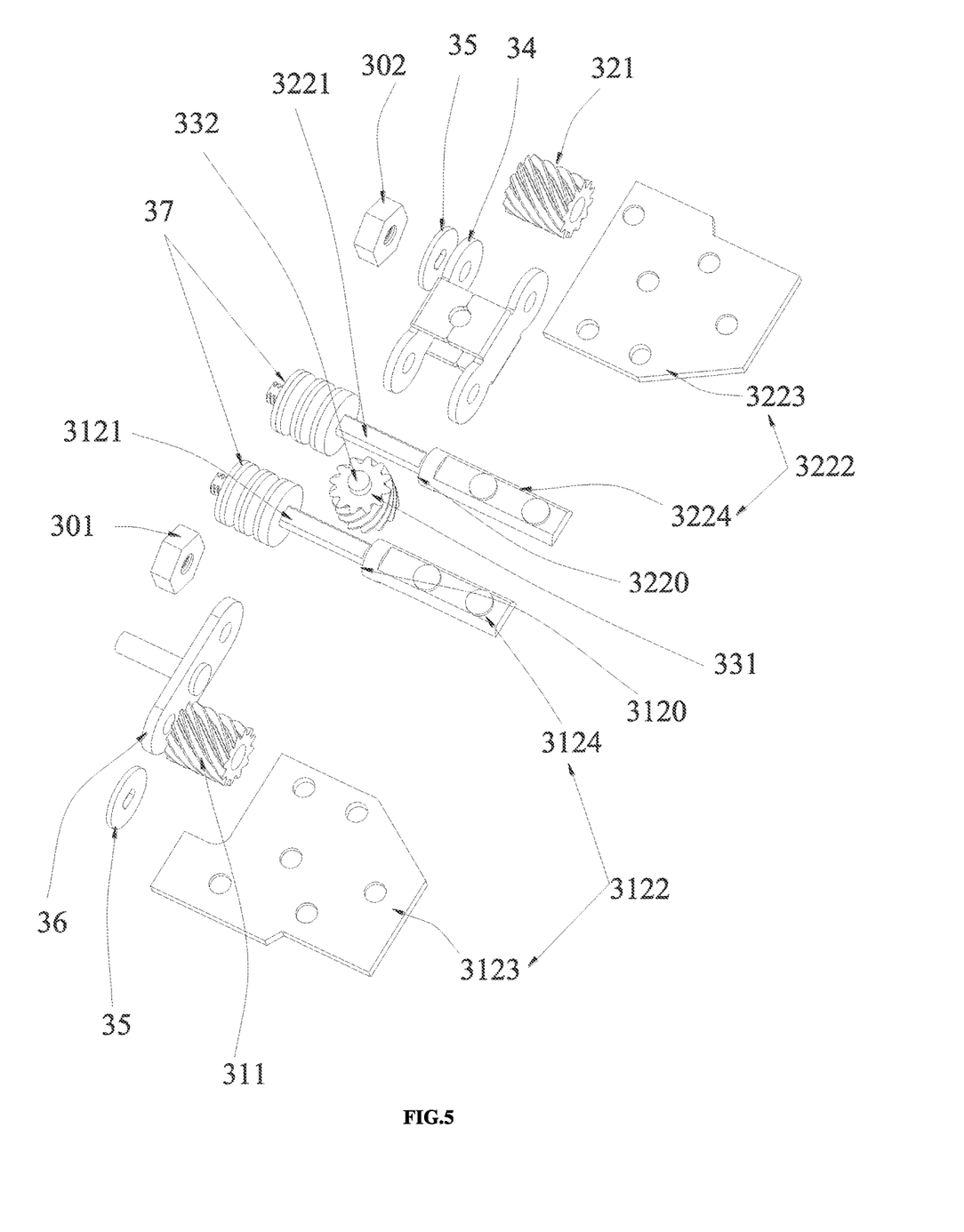
FIG. 5 is an exploded diagram of FIG. 4 provided according to the present disclosure.

In this embodiment, as shown in FIG. 3 to FIG. 4, the first connection component 31 includes a first bevel gear 311 and a first connector 312; the second connection component 32 includes a second bevel gear 321 and a second connector 322; the third connection component 33 includes a third bevel gear 331; the first connector 312 is fixedly connected to the first display screen 1; the first bevel gear 311 is fixedly clamped to the first connector 312; the second connector 322 is fixedly connected to the second display screen 2; the second bevel gear 321 is fixedly clamped to the second connector 322; and the first bevel gear 311 and the second bevel gear 321 are both connected to the third bevel gear 331, so that when the first bevel gear 311 rotates, the first bevel gear 311 drives the second bevel gear 321 to rotate in a direction opposite to the first bevel gear 311 through the third bevel gear 331. Due to the connected rotation between the gears, the first display screen drives the second display screen through transmission between the gears, achieving a simple structure and high transmission linkage. Moreover, the bevel gears has good meshing performance and a high overlapping degree. The bevel gears have long meshing time and a large contact area, so that stress is reduced, window openings are steadier, and the economy is also improved. In addition, the bevel gears are compact in structure and have a relatively ideal speed reduction effect.

In this embodiment, as shown in FIG. 3 to FIG. 4, the hinge device 3 further includes a fourth connector 34; the third bevel gear 331 is provided with a central shaft 332 integrally formed with the third bevel gear 331; two ends of the central shaft 332 pass through two sides of the third bevel gear 331; two ends of the fourth connector 34 are connected to the first connector 312 and the second connector 322; and a middle portion of the fourth connector 34 is clamped to the central shaft 332. The fourth connector 34 is mainly to fix the third bevel gear to prevent poor user experience caused by poor stability of the third bevel gear in a rotating process.

Figure 6:
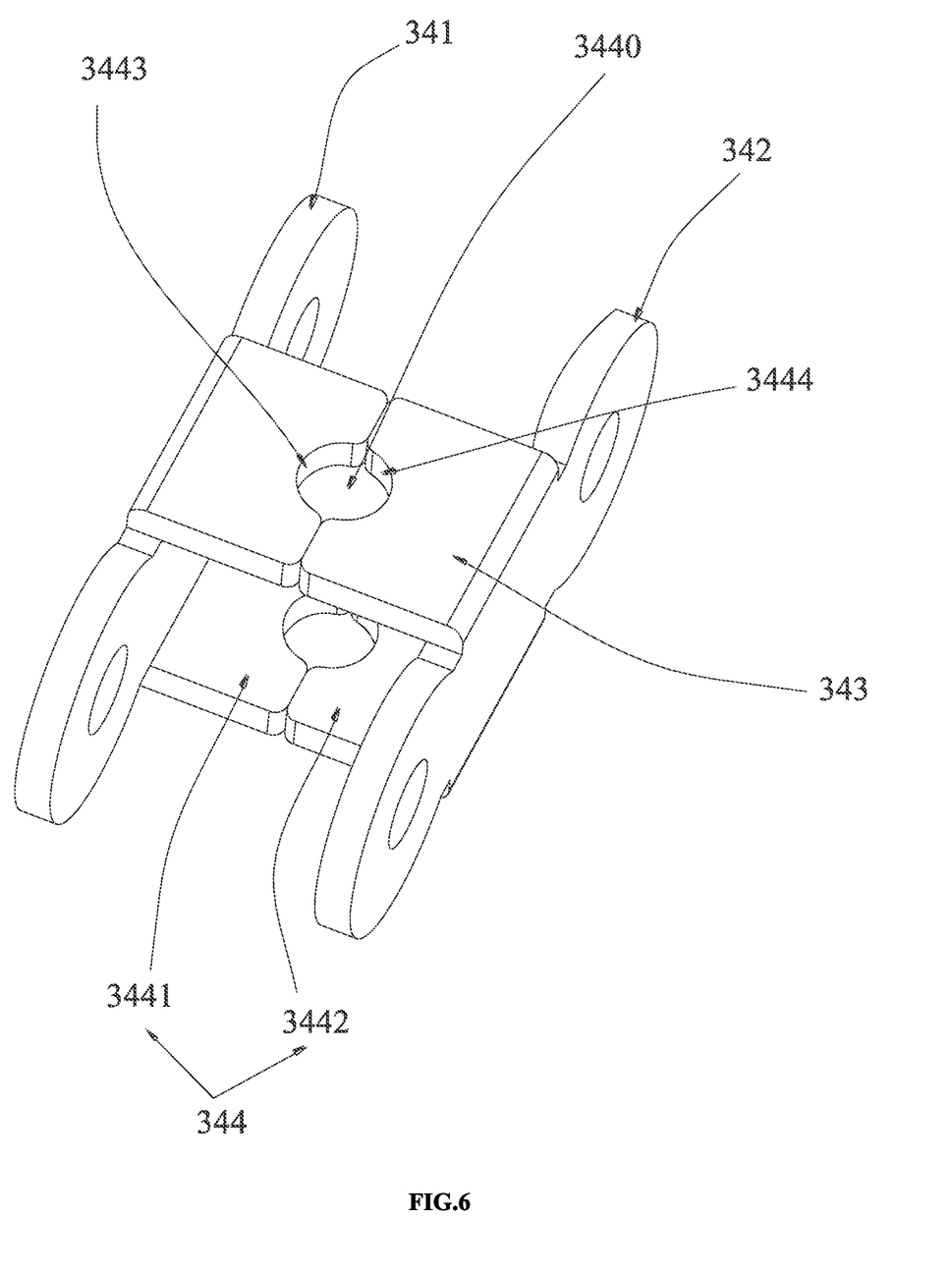
FIG. 6 is a three-dimensional diagram of a fourth connector provided according to the present disclosure.

As shown in FIG. 6, the fourth connector 34 includes a first connection plate 341, a second connection plate 342, a third connection plate 343, and a fourth connection plate 344; left and right ends of the first connection plate 341 are connected to the first connector 312 and the second connector 322 and are located at a first end of the first bevel gear 311 and a first end of the second bevel gear 321; left and right ends of the second connection plate 342 are connected to the first connector 312 and the second connector 322 and are located at a second end of the first bevel gear 311 and a second end of the second bevel gear 321; the third connection plate 343 and the fourth connection plate 344 are arranged on two sides of the third bevel gear 331; two ends of the third connection plate 343 and two ends of the fourth connection plate 344 are fixedly connected to the first connection plate 341 and the second connection plate 342; mounting holes 3440 are formed in the third connection plate 343 and the fourth connection plate 344; and the mounting holes 3440 sleeve the central shaft 332.

In this embodiment, as shown in FIG. 6, each of the third connection plate 343 and the fourth connection plate 344 includes a first connection portion 3441 and a second connection portion 3442; the first connection portion 3441 and the second connection portion 3442 can be in splicable connection; one end of the first connection portion 3441 is fixedly connected to the first connection plate 341, and one end of the second connection portion 3442 is fixedly connected to the second connection plate 342; the other end of the first connection portion 3441 is provided with a first groove 3443, and the other end of the second connection portion 3442 is provided with a second groove 3444; and when the first connection portion 3441 is spliced with the second connection portion 3442, the first groove 3443 is spliced with the second groove 3444 to form the mounting hole 3440. The third connection plate 343 and the fourth connection plate 344 are divided into two parts, which is more convenient for assembling of the hinge device. If the first connection plate 341, the second connection plate 342, the third connection plate 343, and the fourth connection plate 344 are integrally formed, the first bevel gear, the second bevel gear, and the third bevel gear are inconvenient to assemble.

In this embodiment, as shown in FIG. 3 to FIG. 4, the first connector 312 includes a first fixing shaft 3121 and a first fixing member 3122; the hinge device 3 further includes a first nut 301; the first fixing member 3122 is fixedly connected to one end of the first fixing shaft 3121; the first fixing member 3122 is fixedly connected to the first display screen 1; a first stop portion 3120 is arranged between the first fixing member 3122 and a connection end of the first fixing shaft 3121; the first connection plate 341, the first bevel gear 311, and the second connection plate 342 are connected to the first fixing shaft 3121, and are arranged near the first stop portion 3120 in sequence; and the first connection plate 341, the first bevel gear 311, and the second connection plate 342 are compressed between the first nut 301 and the first stop portion 3120 through the first nut 301. The stop portion prevents the first connection plate from falling out of the first fixing shaft 3121, and the nut is used to press the first connection plate 341, the first bevel gear 311, and the second connection plate 342, which mainly prevents the second connection plate from falling out of the first fixing shaft, so that the entire hinge device rotates more stably. The first connector 312 includes the first fixing shaft 3121 and the first fixing member 3122, making it more convenient for the hinge device to fixedly connect the first display screen to the second display screen. That is, the first connector 312 is divided into a fixed connection region and a rotatable connection region, so that significant partitioning is more convenient for assembling personnel to assemble the hinge device.

In this embodiment, as shown in FIG. 3 to FIG. 4, the first fixing member 3122 includes a first fixing plate 3123 and a first connection shaft 3124; the first stop portion 3120 is arranged at a connection end of the first connection shaft 3124; one end of the first fixing plate 3123 is fixedly connected to the first connection shaft 3124; and the other end of the first fixing plate 3123 is fixedly connected to the first display screen 1. The first connection shaft 3124 connects the first fixing shaft 3121 to the first fixing plate 3123. The first fixing plate is arranged to facilitate the assembling of the hinge device and the display screens. Due to the plate shape, a plurality of bolts and nuts are used for fixed connection, so that the hinge device and the display screens are more stable, may not be damaged or separated after being used for a long time, and are also convenient to disassemble. In this implementation, the first connection shaft and the first fixing shaft are integrally formed. This makes the first connection shaft and the first fixing shaft more stable and also facilitates demolding.

In this embodiment, as shown in FIG. 3 to FIG. 4, the second connector 322 includes a second fixing shaft 3221 and a second fixing member 3222; the hinge device 3 further includes a second nut 302; the second fixing member 3222 is fixedly connected to one end of the second fixing shaft 3221; the second fixing member 3222 is fixedly connected to the second display screen 2; a second stop portion 3220 is arranged between the second fixing member 3222 and a connection end of the second fixing shaft 3221; the first connection plate 341, the second bevel gear 321, and the second connection plate 342 are connected to the second fixing shaft 3221, and are arranged near the second stop portion 3220 in sequence; and the first connection plate 341, the second bevel gear 321, and the second connection plate 342 are compressed between the second nut 302 and the second stop portion 3220 through the second nut 302. The stop portion prevents the first connection plate from falling out of the second fixing shaft 3221, and the nut is used to press the first connection plate 341, the second bevel gear 321, and the second connection plate 342, which mainly prevents the second connection plate from falling out of the second fixing shaft, so that the entire hinge device rotates more stably. The second connector 322 includes the second fixing shaft 3221 and the second fixing member 3222, making it more convenient for the hinge device to fixedly connect the first display screen to the second display screen. That is, the second connector 322 is divided into a fixed connection region and a rotatable connection region, so that significant partitioning is more convenient for assembling personnel to assemble the hinge device.

In this embodiment, as shown in FIG. 3 to FIG. 4, the second fixing member 3222 includes a second fixing plate 3223 and a second connection shaft 3224; the second stop portion 3220 is arranged at a connection end of the second connection shaft 3224; one end of the second fixing plate 3223 is fixedly connected to the second connection shaft 3224; and the other end of the second fixing plate 3223 is fixedly connected to the second display screen 2. The second connection shaft 3221 connects the second fixing shaft to the second fixing plate 3223. The second fixing plate is arranged to facilitate the assembling of the hinge device and the display screens. Due to the plate shape, a plurality of bolts and nuts are used for fixed connection, so that the hinge device and the display screens are more stable, may not be damaged or separated after being used for a long time, and are also convenient to disassemble. In this implementation, the second connection shaft 3224 and the second fixing shaft are integrally formed. This makes the second connection shaft 3224 and the second fixing shaft more stable and also facilitates demolding.

Figure 7:
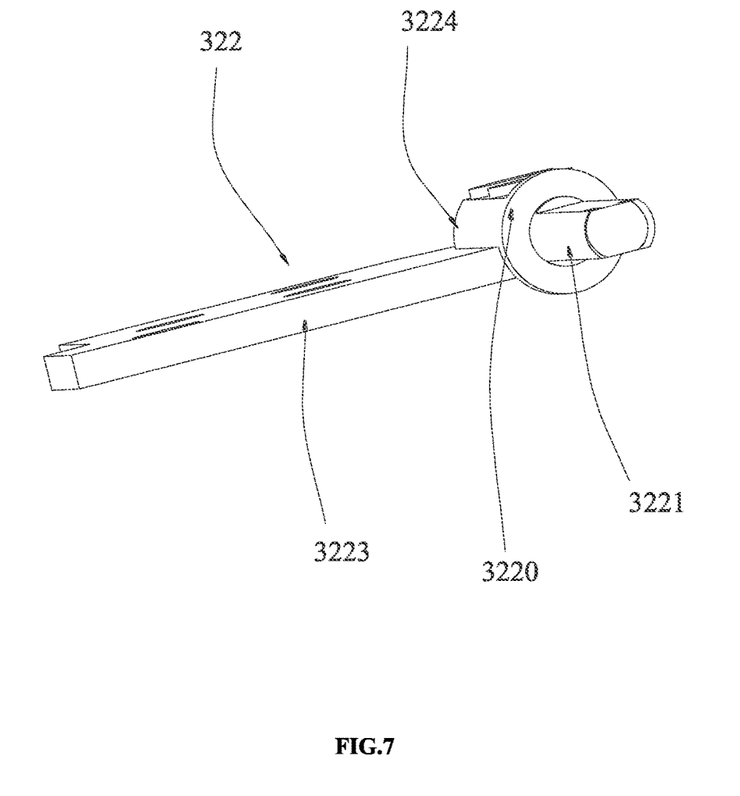
FIG. 7 is a three-dimensional diagram of a second connector provided according to the present disclosure.
Figure 8:
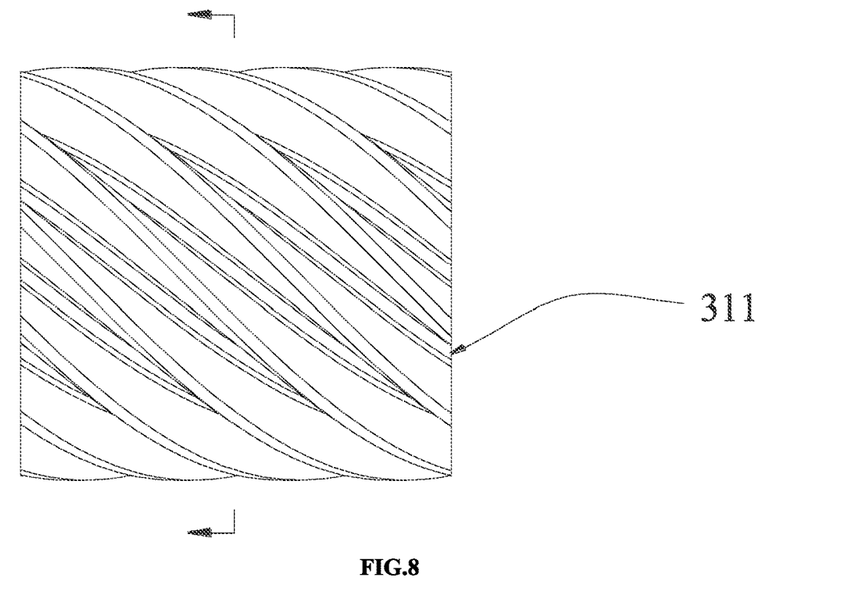
FIG. 8 is a diagram of a front surface of a first bevel gear provided according to the present disclosure.
Figure 9:
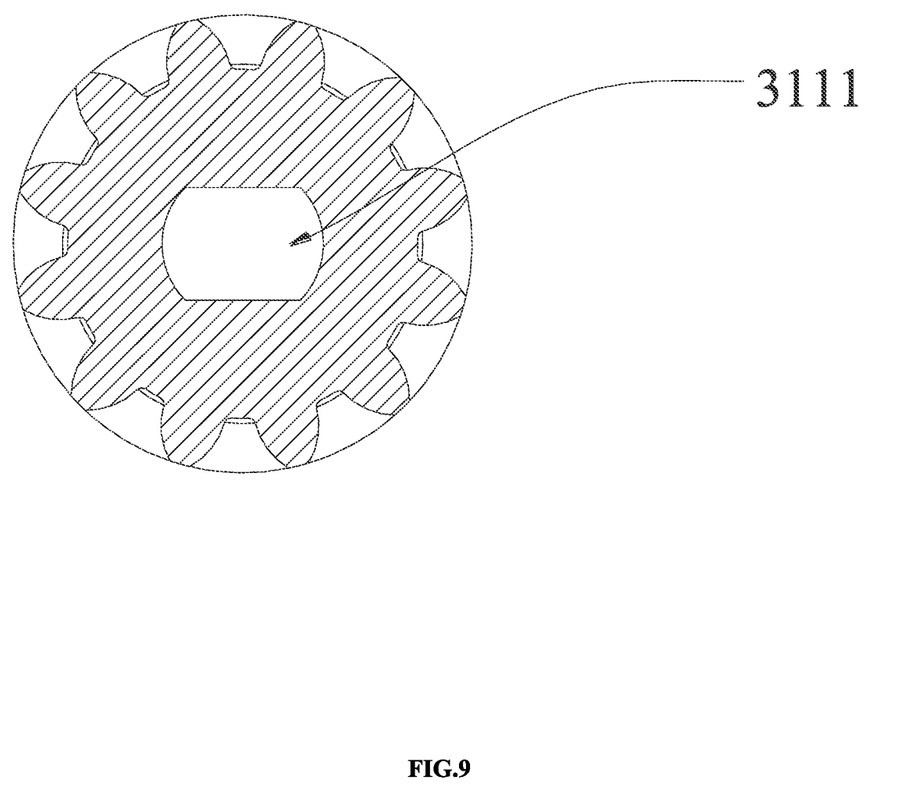
FIG. 9 is a cutaway diagram of FIG. 8 provided according to the present disclosure.

The first fixing shaft and the second fixing shaft mentioned above are preferably set to be cylindrical, and two sides of a cylindrical surface of each cylinder are provided with corresponding tangent planes. The gears are clamped to the cylinders with the tangent planes. As shown in FIG. 7 showing a schematic diagram of the second fixing shaft 3221. The shape of the first fixing shaft and the shape of the second fixing shaft are the same, and the cylindrical surfaces are provided with the tangent planes. As shown in FIG. 9 showing a cutaway diagram of the first bevel gear, a through hole 3111 is formed. The through hole in the second bevel gear and the through hole in the first bevel gear are consistent, so the gears cannot rotate on the cylinders, and there is no need to arrange clamping members to fix the gears on the fixing shafts. This structure has a long service life.

In this embodiment, as shown in FIG. 3 to FIG. 4, the hinge device 3 further includes a fifth connection plate 36; one end of the fifth connection plate 36 is connected to the first fixing shaft 3121 and is located between the first nut 301 and a first pad 35 arranged on the first connection shaft 3121, and the other end of the fifth connection plate 36 is connected to the second fixing shaft 3221 and is located between the second nut 302 and a first pad 35 arranged on the second fixing shaft 3221. The arrangement of the fifth connection plate 36 improves the stability between the first connection component, the second connection component, and the third connection component.

In this embodiment, the first pad 35 are arranged between the first fixing shaft 3121 and the second fixing shaft 3221, and are located between the first bevel gear 311 and the first nut 301 as well as between the second bevel gear 321 and the second nut 302; and two or more second pads 37 are further arranged between the first fixing shaft 3121 and the second fixing shaft 3221, and are located between the fifth connection plate 36 and the first nut 301 as well as between the fifth connection plate 36 and the second nut 302.

In this embodiment, as shown in FIG. 3, the hinge device 3 further includes a shell 38; one end of the first connection component 31, one end of the second connection component 32, and the third connection component 33 are arranged in the shell 38; the other end of the first connection component 31 is fixedly connected to the first display screen 1; and the other end of the second connection component 32 is fixedly connected to the second display screen 2. The shell makes a cleaner appearance for the entire hinge device.

In this embodiment, as shown in FIG. 3, the first display screen 1 and the second display screen 2 are connected through a signal transmission line 4. The signal transmission line 4 passes through the hinge device 3 to facilitate the signal connection between the first display screen and the second display screen.

Figure 2:
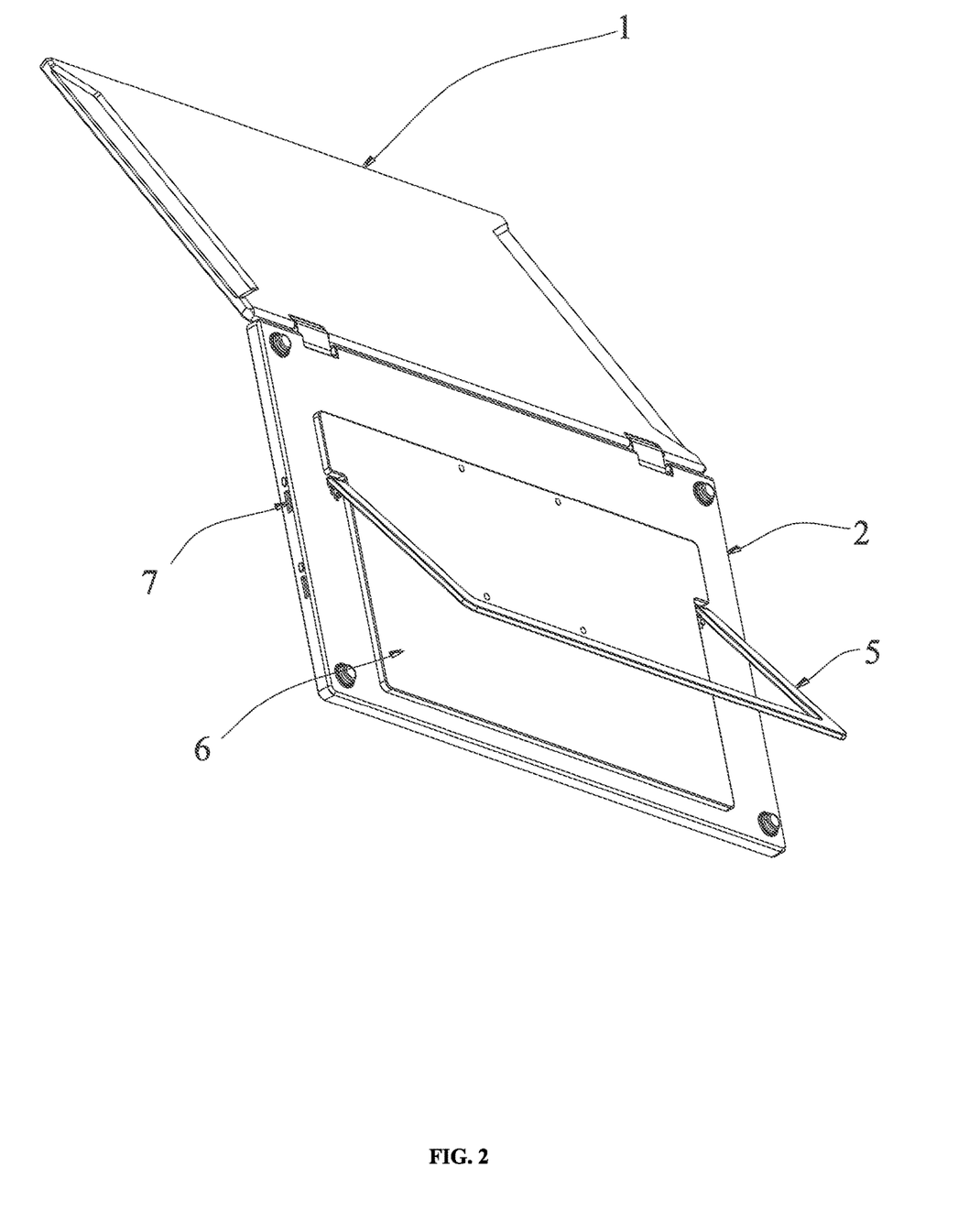
FIG. 2 is a three-dimensional diagram of a back surface of a dual-screen display provided according to the present disclosure.

In this embodiment, as shown in FIG. 1 to FIG. 2, there are two hinge devices 3, so that the two display screens have longer service lives.

In this embodiment, as shown in FIG. 1 to FIG. 2, the first display screen 1 and the second display screen 2 are flipped up and down, and the flipping up and down do not occupy a plane. Users feel more comfortable when watching upper and lower screens.

In this embodiment, the dual-screen display as shown in FIG. 2 further includes a support 5; the support 5 is arranged in the middle of the back surface of the second display screen 2; the support 5 is rotatably connected to the second display screen 2; and the support 5 is configured to support the second display screen 2 and the first display screen. The support 5 can rotate from 0° to 180°, so that users can adjust a viewing angle more easily. If no support is arranged, the user has to find other supporting objects or hold an extended screen in a hand. The support can make the display screens stand on a platform, making it easy for the user to use.

In this embodiment, the support 5 as shown in FIG. 1 to FIG. 2 is a U-shaped support; a cover plate 6 is convexly arranged on the back surface of the second display screen 2; two ends of the U-shaped support are rotatably connected to two sides of the cover plate 6; and when the U-shaped support is not unfolded, the U-shaped support sleeves an outer side of the cover plate 6 and abuts against a plane of the back surface of the second display screen 2. The U-shaped support is high in stability.

In this embodiment, as shown in FIG. 1 to FIG. 2, the second display screen 2 is provided with more than one connection interface 7. The connection interfaces can be Type C interfaces and Type-A interfaces, so that the display can be connected to an external power supply or other devices.

As a whole, by using the hinge device, the first display screen can rotate until the front surface of the first display screen abuts against the front surface of the second display screen, and the back surface of the first display screen abuts against the back surface of the second display screen. Furthermore, the first display screen drives the second display screen to rotate opposite to the first display screen through the hinge device, and the support is also arranged on the back surface of the second display screen. A screen body of the first display screen and a screen body of the second display screen can be located on different sides for many people to watch. The function of the dual-screen display is expanded, and a rotating angle of the first display screen and a rotating angle of the second display screen are the same, thereby improving the smoothness of rotation between the display screens. Furthermore, the display is supported by the support to stand, so that the user experience is overall improved.

The above descriptions are only preferred embodiments of the present disclosure, and are not intended to limit the patent scope of the present disclosure. Any equivalent structural transformation made by using the content of the specification and the drawings of the present disclosure under the invention idea of the present disclosure, directly or indirectly applied to other related technical fields, shall all be included in the scope of patent protection of the present disclosure.

What is claimed is:

1. A dual-screen display, wherein the dual-screen display comprises a first display screen, a second display screen, and a hinge device, wherein the first display screen is electrically connected to the second display screen; the first display screen is connected to the second display screen through the hinge device; and the first display screen rotates until a front surface of the first display screen abuts against a front surface of the second display screen, and a back surface of the first display screen abuts against a back surface of the second display screen, wherein the hinge device comprises a first connection component, a second connection component, and a third connection component; the first connection component is fixedly connected to the first display screen; the second connection component is fixedly connected to the second display screen; the third connection component is rotatably connected to both the first connection component and the second connection component; and when the first connection component rotates, the first connection component drives the second connection component to rotate in a direction opposite to the first connection component through the third connection component, wherein the first connection component comprises a first bevel gear and a first connector; the second connection component comprises a second bevel gear and a second connector; the third connection component comprises a third bevel gear; the first connector is fixedly connected to the first display screen; the first bevel gear is fixedly clamped to the first connector; the second connector is fixedly connected to the second display screen; the second bevel gear is fixedly clamped to the second connector; and the first bevel gear and the second bevel gear are both connected to the third bevel gear, so that when the first bevel gear rotates, the first bevel gear drives the second bevel gear to rotate in a direction opposite to the first bevel gear through the third bevel gear, wherein the hinge device further comprises a fourth connector; the third bevel gear is provided with a central shaft integrally formed with the third bevel gear; two ends of the central shaft pass through two sides of the third bevel gear; two ends of the fourth connector are connected to the first connector and the second connector; and a middle portion of the fourth connector is clamped to the central shaft, wherein the fourth connector comprises a first connection plate, a second connection plate, a third connection plate, and a fourth connection plate; left and right ends of the first connection plate are connected to the first connector and the second connector and are located at a first end of the first bevel gear and a first end of the second bevel gear; left and right ends of the second connection plate are connected to the first connector and the second connector and are located at a second end of the first bevel gear and a second end of the second bevel gear; the third connection plate and the fourth connection plate are arranged on two sides of the third bevel gear; two ends of the third connection plate and two ends of the fourth connection plate are fixedly connected to the first connection plate and the second connection plate; mounting holes are formed in the third connection plate and the fourth connection plate; and the mounting holes sleeve the central shaft, wherein each of the third connection plate and the fourth connection plate comprises a first connection portion and a second connection portion; the first connection portion and the second connection portion are in splicable connection; one end of the first connection portion is fixedly connected to the first connection plate, and one end of the second connection portion is fixedly connected to the second connection plate; the other end of the first connection portion is provided with a first groove, and the other end of the second connection portion is provided with a second groove; and when the first connection portion is spliced with the second connection portion, the first groove is spliced with the second groove to form the mounting hole.

2. The dual-screen display according to claim 1, wherein when the first display screen rotates, the first display screen drives the second display screen to rotate opposite to the first display screen through the hinge device.

3. The dual-screen display according to claim 1, wherein the first connector comprises a first fixing shaft and a first fixing member: the hinge device further comprises a first nut: the first fixing member is fixedly connected to one end of the first fixing shaft: the first fixing member is fixedly connected to the first display screen; a first stop portion is arranged on the first fixing member and a connection end of the first fixing shaft: the first connection plate, the first bevel gear, and the second connection plate are connected to the first fixing shaft, and are arranged near the first stop portion in sequence; and the first connection plate, the first bevel gear, and the second connection plate are compressed between the first nut and the first stop portion through the first nut.

4. The dual-screen display according to claim 3, wherein the first fixing member comprises a first fixing plate and a first connection shaft: the first stop portion is arranged at a connection end of the first connection shaft; one end of the first fixing plate is fixedly connected to the first connection shaft; and the other end of the first fixing plate is fixedly connected to the first display screen.

5. The dual-screen display according to claim 4, wherein the second connector comprises a second fixing shaft and a second fixing member: the hinge device further comprises a second nut; the second fixing member is fixedly connected to one end of the second fixing shaft; the second fixing member is fixedly connected to the second display screen: a second stop portion is arranged between the second fixing member and a connection end of the second fixing shaft; the first connection plate, the second bevel gear, and the second connection plate are connected to the second fixing shaft, and are arranged near the second stop portion in sequence; and the first connection plate, the second bevel gear, and the second connection plate are compressed between the second nut and the second stop portion through the second nut.

6. The dual-screen display according to claim 5, wherein the second fixing member comprises a second fixing plate and a second connection shaft; the second stop portion is arranged at a connection end of the second connection shaft: one end of the second fixing plate is fixedly connected to the second connection shaft; and the other end of the second fixing plate is fixedly connected to the second display screen.

7. The dual-screen display according to claim 6, wherein the hinge device further comprises a fifth connection plate: one end of the fifth connection plate is connected to the first fixing shaft and is located between the first nut and a first pad arranged on the first connection shaft, and the other end of the fifth connection plate is connected to the second fixing shaft and is located between the second nut and a first pad arranged on the second fixing shaft.

8. The dual-screen display according to claim 7, wherein the first pads are arranged on the first fixing shaft and the second fixing shaft, and are located between the first bevel gear and the first nut as well as between the second bevel gear and the second nut; and two or more second pads are further arranged on the first fixing shaft and the second fixing shaft, and are located between the fifth connection plate and the first nut as well as between the fifth connection plate and the second nut.

9. The dual-screen display according to claim 1, wherein the hinge device further comprises a shell: one end of the first connection component, one end of the second connection component, and the third connection component are arranged in the shell; the other end of the first connection component is fixedly connected to the first display screen; and the other end of the second connection component is fixedly connected to the second display screen.

10. The dual-screen display according to claim 1, wherein the first display screen is connected to the second display screen through a signal transmission line, and the signal transmission line passes through the hinge device.

11. The dual-screen display according to claim 1, wherein there are two hinge devices.

12. The dual-screen display according to claim 1, wherein the first display screen and the second display screen are flipped up and down.

13. The dual-screen display according to claim 1, wherein the dual-screen display further comprises a support: the support is arranged in the middle of the back surface of the second display screen: the support is rotatably connected to the second display screen; and the support is configured to support the second display screen and the first display screen.

14. The dual-screen display according to claim 13, wherein the support is a U-shaped support: a cover plate is convexly arranged on the back surface of the second display screen: two ends of the U-shaped support are rotatably connected to two sides of the cover plate; and when the U-shaped support is not unfolded, the U-shaped support sleeves an outer side of the cover plate and abuts against a plane of the back surface of the second display screen.

15. The dual-screen display according to claim 1, wherein the second display screen is provided with more than one connection interface.

* * * * *